United States Patent
Bajdechi et al.

(10) Patent No.: US 7,403,041 B2
(45) Date of Patent: Jul. 22, 2008

(54) TECHNIQUES FOR ENABLING A 10BT ACTIVE OUTPUT IMPEDANCE LINE DRIVER USING A LOW POWER SUPPLY

(75) Inventors: Ovidiu Bajdechi, Delft (NL); Christopher M. Ward, Utrecht (NL)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 11/798,294

(22) Filed: May 11, 2007

(65) Prior Publication Data

US 2007/0273444 A1    Nov. 29, 2007

Related U.S. Application Data

(60) Provisional application No. 60/799,349, filed on May 11, 2006.

(51) Int. Cl.
*H03K 19/094*    (2006.01)
*H03K 19/0175*    (2006.01)

(52) U.S. Cl. ............... 326/86; 326/30; 326/82

(58) Field of Classification Search .......... 326/30, 326/82–83, 86, 90
See application file for complete search history.

(56) References Cited

U.S. PATENT DOCUMENTS

| | | | | |
|---|---|---|---|---|
| 6,665,347 | B2* | 12/2003 | van Bavel et al. | 375/257 |
| 6,724,219 | B1* | 4/2004 | Kim et al. | 326/30 |
| 2004/0201416 | A1* | 10/2004 | Wyers et al. | 330/2 |
| 2007/0296456 | A1* | 12/2007 | van der Goes et al. | 326/30 |

* cited by examiner

*Primary Examiner*—Anh Q Tran
(74) *Attorney, Agent, or Firm*—Sterne, Kessler, Goldstein & Fox P.L.L.C.

(57) ABSTRACT

A line driver for generating 10BT signals is disclosed. Digital symbols to be transmitted via a 10 BT Ethernet line are converted by a digital-to-analog converter into a corresponding analog voltage signal, which is fed into an active output impedance line driver. The digital-to-analog converter also receives a reference voltage reflecting variations of the supply voltage and adjusts its output signal accordingly to provide a deliberately variable analog voltage signal to the line driver.

22 Claims, 6 Drawing Sheets

TECHNIQUES FOR ENABLING A 10BT ACTIVE OUTPUT IMPEDANCE LINE DRIVER USING A LOW POWER SUPPLY

CROSS-REFERENCE TO RELATED APPLICATIONS

This application claims priority to U.S. Provisional Application No. 60/799,349, filed on May 11, 2006, which is incorporated by reference in its entirety herein.

BACKGROUND OF THE INVENTION

The Institute of Electrical and Electronics Engineers (IEEE) inter alia sets the standards for communication devices interchanging information using the Ethernet protocol in order to enable for example different manufacturers to produce devices complying with the same specifications and thus being compatible to each other. For example 10 BT is a well known Ethernet standard protocol for transmitting digital information at a transmission speed of 10 Mbit/s.

The IEEE 802.3 standard defines the requirements for transmitting information using the 10 BT protocol on unshielded twisted pair (UTP) lines, wherein numerous details are specified in the sections of the standard. For example section 14.3 of IEEE 802.3 "MAU electrical specifications" specifies a differential output voltage between 2.2 Volts and 2.8 Volts on a load of 100Ω. Wherein for a load with varying impedance in the range of 86.8Ω to 115Ω it is specified that the transmitter has to provide an output impedance in a range of approximately 80Ω to 120 Ω.

As a widely spread supply voltage for integrated circuits (ICs) is 3.3 Volts active impedance line drivers are also implemented using operational amplifiers operated at this nominal voltage, wherein the supply voltage often is allowed to vary by 10%. Accordingly a nominal supply voltage of 3.3 Volts can drop to 3.0 Volts. Regarding the requirements of the IEEE 802.3 standard for 10 BT protocol such a voltage drop is considerable in view of maintaining the required output voltage swing and output impedance of the line driver. In particular the design of the output stage of a 10 BT line driver becomes difficult, because the output stage of the line driver controls the output voltage and output impedance of the driver. Accordingly the design of an active output impedance line driver for transmitting symbols using the 10 BT protocol gravitates around trading output swing for control of the output impedance, with the intention to keep the transistors in the amplifier's output stage out of linear operation, because a linear operation of the transistors can cause gain drop or even instability of the amplifier and thus of the entire circuit. That is, in order to maintain the transistors operate in a non-linear region, their source-drain voltage must be large enough. Hence when designing an output stage of a 10 BT line driver operated at a supply voltage of 3.3 Volts with an admissible variation of ±10% care must be taken to provide for a large enough source-drain voltage of the output stage transistors.

A conventional solution of a 10 BT line driver is shown in FIG. 1. The topology of circuit 100, i.e. the arrangement of elements, is symmetrical to dotted line 101 or the common mode voltage supply $V_{CM}$. Accordingly for an element in the upper half of the drawing, i.e. any element above dotted line 101 having an even reference numeral there is a corresponding element having an uneven reference number (increased by 1). The operation of the two identical circuit portions is also very similar, wherein the circuit portion shown above dotted line 101 processes the positive signal portion output at terminal $V_{OP}$ and the circuit portion below dotted line 101 processes the negative signal portion of the output signal $V_{OUT}$, and wherein the positive and negative portions of the output signal are symmetrical with reference to a common mode voltage.

Circuit 100 takes a voltage $V_{IN}$ as input signal representing the symbol to be transmitted and processed to be output as output voltage $V_{OUT}$, which can be coupled to a transmission line represented as an ohmic resistor $R_{CABLE}$.

The circuit comprises single ended operational amplifiers 110, 111 each coupled with its positive input terminal via resistor R3 120, 121 to a common mode voltage supply $V_{CM}$. Input signal $V_{IN}$ is fed into the negative input terminals of amplifiers 110, 111 via resistors R1 130, 131. A negative feedback loop around each amplifier comprises resistor R2 and optional capacitor $C_{FB}$ 150, 151 and a positive feedback loop comprises resistors R4 160, 161 and optional capacitors 170, 171 and termination resistors $R_T$ 180, 181.

In case that circuit 100 is operated at a supply voltage of 3.3 Volts, which can drop to 3.0 Volts, and the output swing reaches close to its maximum, i.e. close to the supply voltage, then the value of termination resistor $R_T$, which is used to control the output impedance of the line driver, decreases considerably making the positive feedback loop almost as strong as the negative feedback loop, which can lead to an instable operation of the circuit.

The risk of instable operation of the amplifiers is reduced by introducing the capacitors $C_{FB}$ 150, 151 into the feedback loops as shown, but which does not guarantee proper operation in all situations. Thus a supply voltage much higher than the required output swing of $V_{OUT}$ usually is used, for example a supply voltage of 5 Volts.

Thus there is a need for a 10 BT line driver operable at a voltage of 3.3 Volts, which also accurately operates in case the supply voltage drops to 3.0 Volts, and which accurately generates a 10 BT signal within the IEEE 802.3 specifications in these operating conditions.

SUMMARY OF THE INVENTION

The invention relates to an integrated circuit including an active output impedance line driver circuit comprising a differential amplifier, the negative input terminal coupled via an input resistor to an input terminal, the positive output terminal providing an output signal, and wherein at least a feedback resistor forms a negative feedback path, and wherein the positive feedback path is shorted and coupled by an adjustable termination resistor to the residual in- and output terminal of the line driver and a common mode voltage source Furthermore a method is disclosed for operating an integrated circuit comprising an active output, impedance line driver for producing an output signal from an input signal, wherein the amplitude of the input signal is decreased in case the supply voltage of the active output impedance line driver drops.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known processes and steps have not been described in detail in order not to unnecessarily obscure the present invention.

Figure 1:
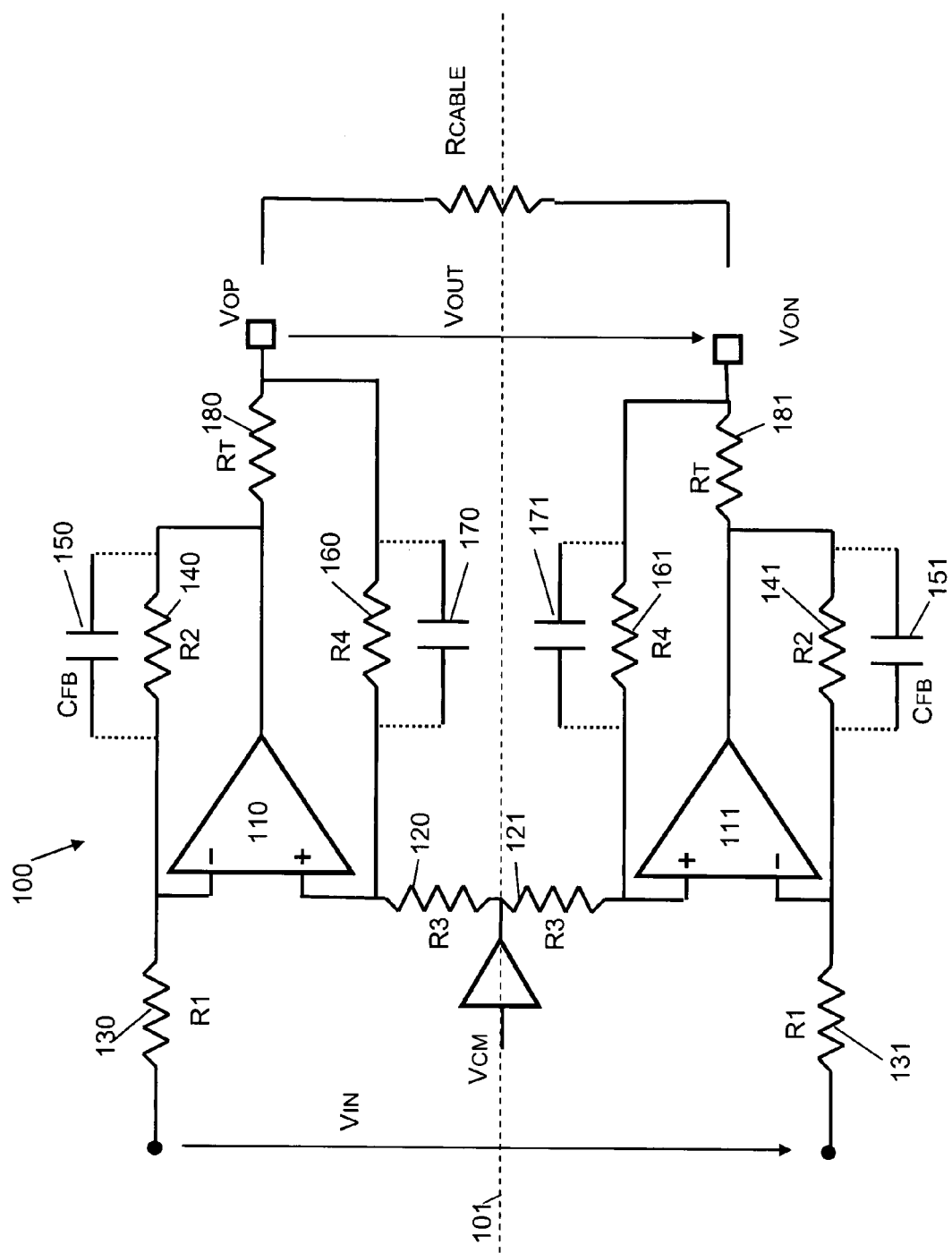
FIG. 1 depicts a schematic of a conventional 10 BT line driver
Figure 2:
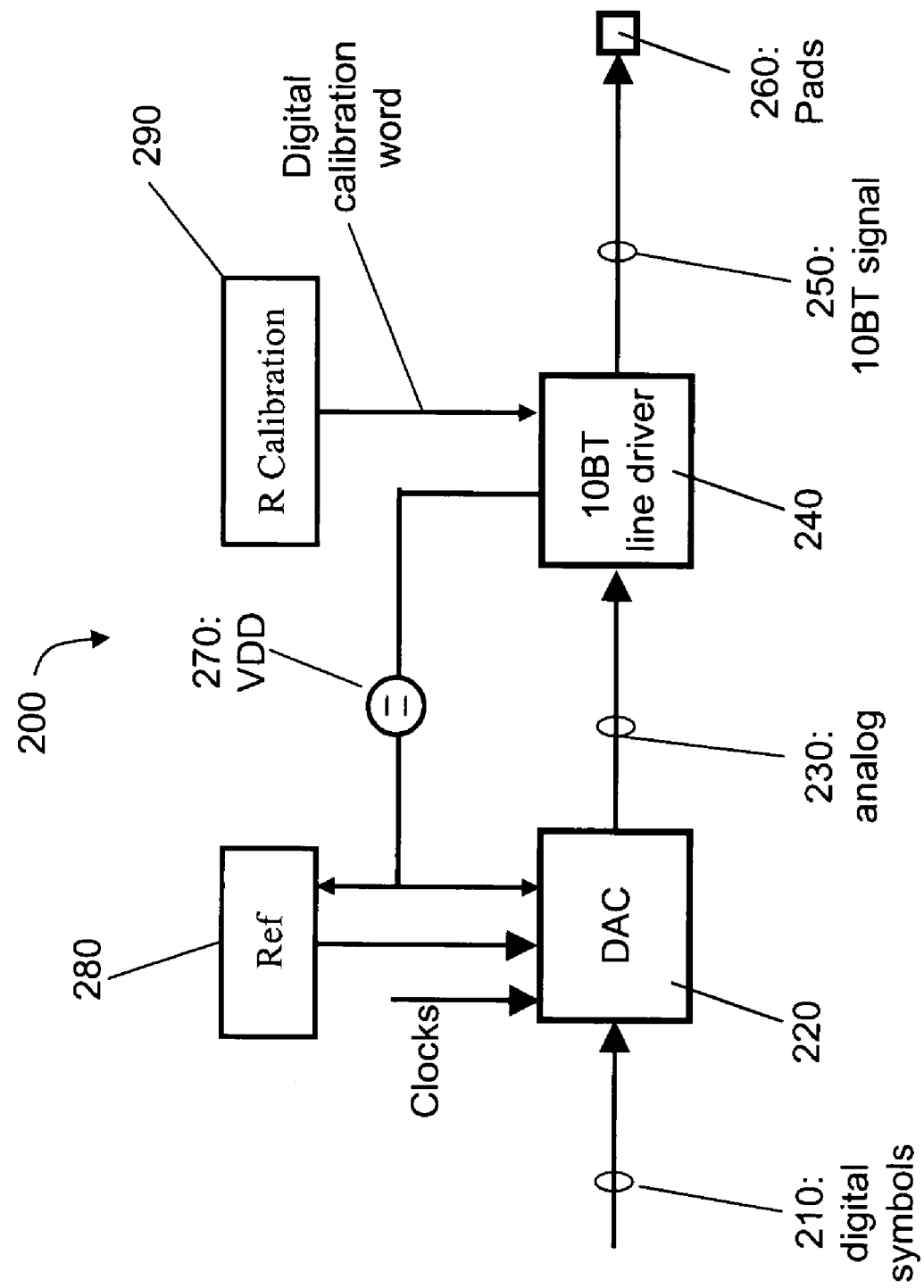
FIG. 2 depicts a schematic overview of a 10 BT line driver circuit

FIG. 2 illustrates a block diagram of the invention. The blocks illustrated herein will be explained in detail hereinafter. The elements used in these blocks for example can be integrated in an integrated circuit (IC) and can be fabricated for example in 90 nm CMOS technology.

In circuit 200 it is assumed that digital symbols 210 are generated by some upstream circuit not shown here. The digital symbols are provided to a digital-to-analog converter (DAC) 220, which also is coupled to a clock signal, and which converts the digital symbols 210 into an analog output signal 230. Analog signal 230 is fed into a 10 BT line driver 240, which produces a 10 BT signal 250 as defined in the IEEE802.3 standard. The 10 BT signal then may be coupled to connection pads 260 of a chip comprising the 10 BT line driver. Connection pads 260 may be coupled to a transmission line to transmit signal 250 to a remote transceiver.

The output signal 230 of DAC 220 may be either an analog current-mode signal, in which the information is coded in the current or a voltage-mode signal, wherein the information is coded in the voltage of the signal. In case signal 230 is voltage coded it may be coupled directly to the 10 BT line driver, because it requires a voltage as input signal as described below.

However, in case signal 230 is a current-mode signal it is to be converted to voltage-mode signal by a conventional transimpedance current-to-voltage converter before being coupled to the 10 BT line driver, which in the here described embodiment requires a voltage as input signal. In its simplest implementation the current-to-voltage converter for example may comprise an operational amplifier having an ohmic resistor in its negative feedback path, wherein the value of the resistor defines the range of the output voltage. While the positive input of the amplifier is coupled to ground, the input current is provided to the inverting input of the amplifier. The output voltage is then produced at the amplifiers output, which may be coupled to the input of the 10 BT line driver 240.

The 10 BT line driver is further coupled to a calibration circuit 290, which provides a digital calibration word for calibrating the value of a termination resistor comprised in the line driver as explained in detail hereinafter.

Furthermore it is assumed that at least the DAC 220 and the 10 BT line driver are supplied by the same supply voltage 270, which in the described embodiment is VDD=3.3 Volts nominal. As mentioned above this supply voltage may for any reason drop to 3.0 Volts, such that DAC 220 and 10 BT line driver are coupled to the same reduced supply voltage. A drop of the supply voltage VDD thus impacts DAC 220 and line driver 240 as well.

As shown in the drawing DAC 120 furthermore is coupled to circuit 280, which is coupled to the supply voltage VDD 270. Circuit 280 generates a signal, which serves as a reference signal in DAC 120 controlling the maximum amplitude of the output signal, such that the output amplitude of the DAC drops by half the voltage drop of the supply voltage. That is, if the supply voltage drops by 0.3 Volts from 3.3 Volts to 3.0 Volts, which is around 9.1%, then the output amplitude of the DAC drops proportionally, i.e. in this case for example by 4.55%.

Figure 3:
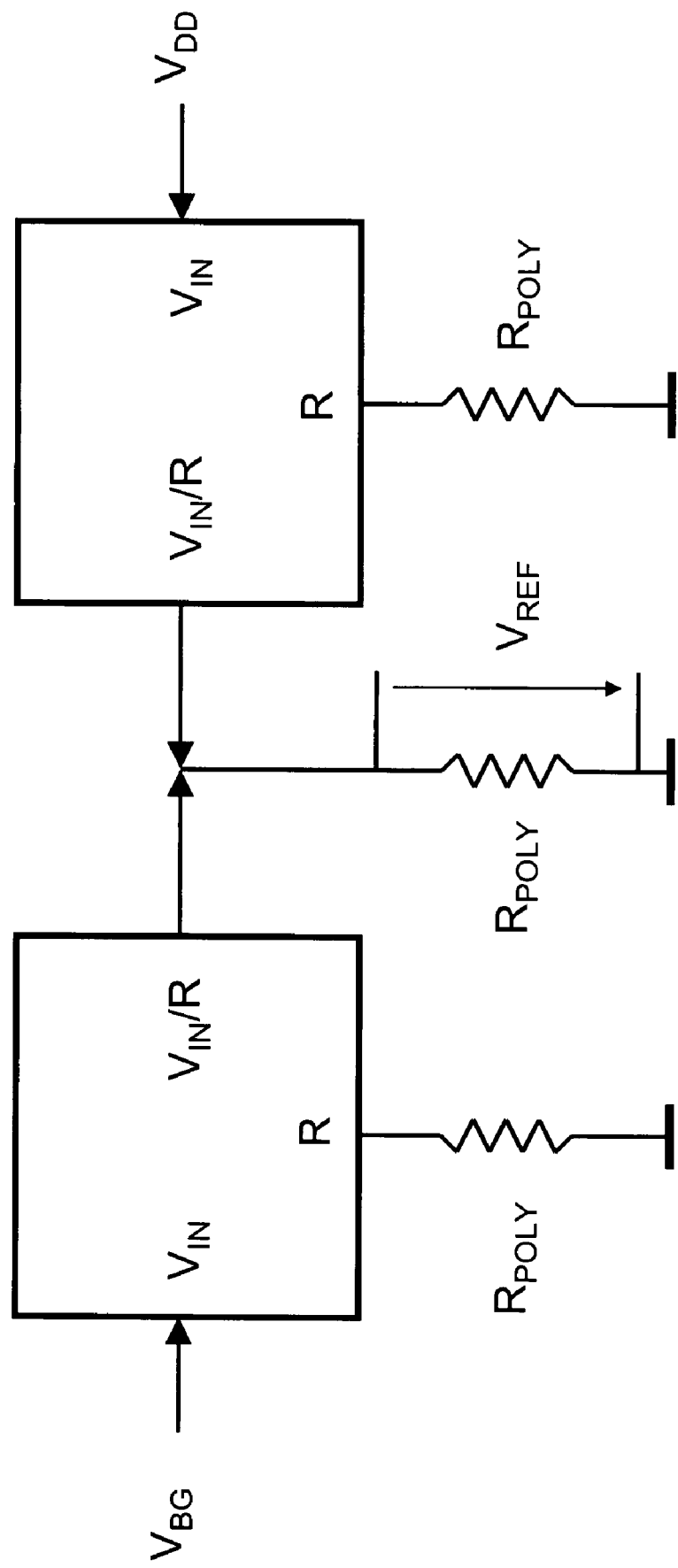
FIG. 3 depicts a schematic circuit for generating reference signal

An exemplary embodiment of a circuit 280 may have a topology as depicted in FIG. 3. A first voltage-to-current converter 310 is coupled to a bandgap reference voltage $V_{BG}$ as input voltage and a polysilicon resistor $R_{Poly}$ 320 and outputs a current of $V_{BG}/R_{POLY}$, wherein the bandgap voltage is the most supply- and process-independent signal that can be generated inside integrated circuits (ICs). A second voltage to current converter 330 is coupled to the supply voltage $V_{DD}$ as its input voltage and to a polysilicon resistor 340 and correspondingly outputs a current of $V_{DD}/R_{POLY}$. The output currents of the current-to-voltage converters are summed on a third polysilicon resistor 350, wherein all resistors 320 and 340 and 350 match in their resistivity values. In this way a voltage of $V_{REF}=\alpha V_{BG}+\beta V_{DD}$, wherein $\alpha$ and $\beta$ depend on the value of the resistors, is produced at resistor 350, which servers as reference input voltage of the DAC.

Figure 4:
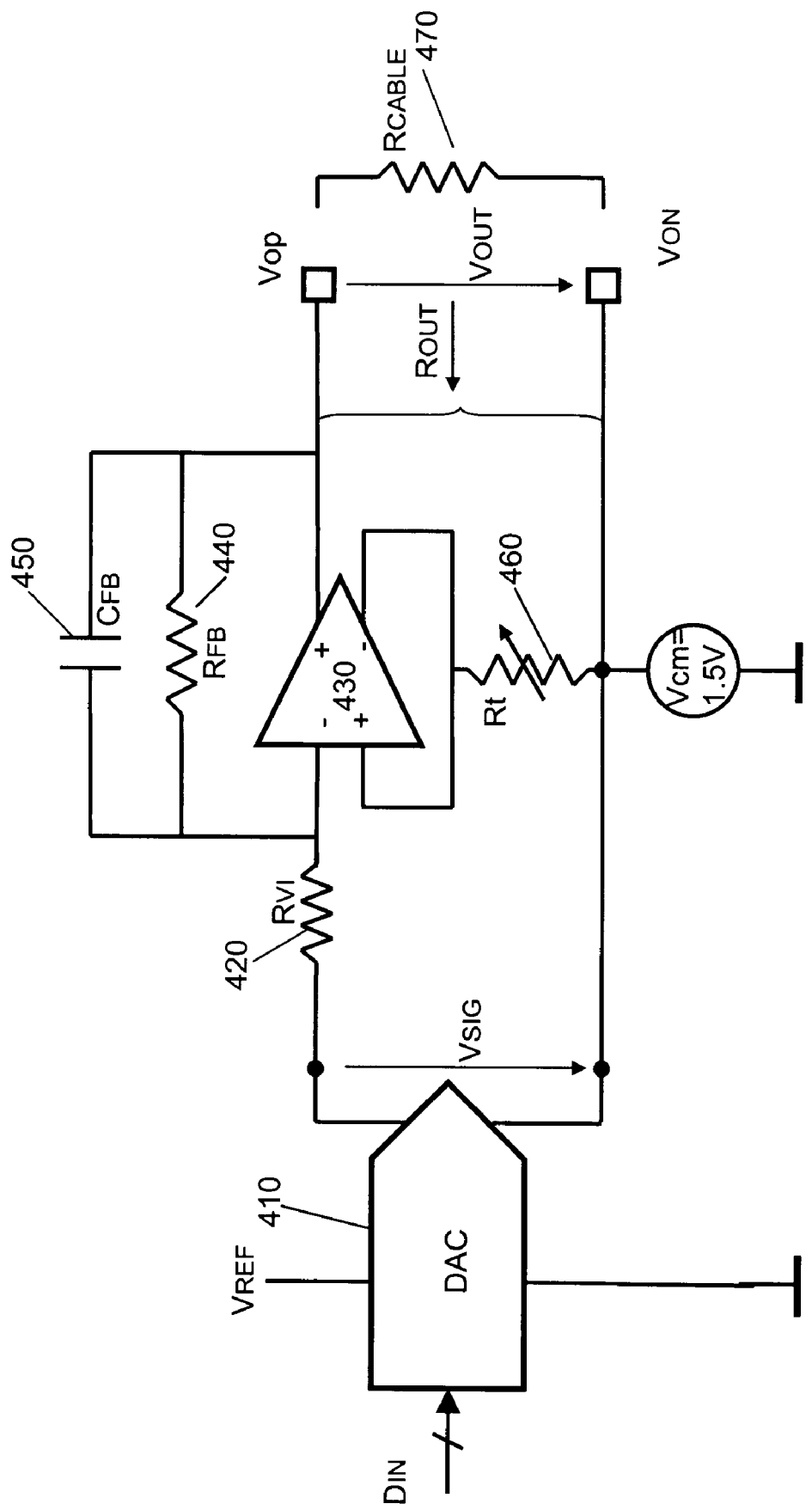
FIG. 4 depicts a schematic circuit of a 10 BT active output impedance line driver

FIG. 4 depicts a circuit 400 of an exemplary implementation of an active output impedance line driver, which can be used as 10 BT line driver 240 in FIG. 2. Circuit 400 comprises a digital-to-analog converter 410 which receives digital symbols $D_{IN}$ and the reference voltage $V_{REF}$ and outputs a voltage signal $V_{SIG}$, wherein $V_{SIG}$ is proportional to the digital input signal $D_{IN}$ and the reference voltage $V_{REF}$. As described with reference to FIG. 3 $V_{REF}$ is generated as a combination of a supply-dependent current and a supply-independent current it can be made to vary in any ratio with the supply voltage. Accordingly the output voltage signal of DAC 410 decreases proportionally if the supply voltage drops and increases proportionally if the supply voltage exceeds its nominal value.

$V_{SIG}$ is fed into the circuit, which comprises an input resistor $R_{VT}$ 420 coupled to the input signal $V_{SIG}$ and to the negative input terminal of differential amplifier 430. Differential amplifier 430 comprises in its negative feedback loop a feedback resistor $R_{FB}$ 440 parallel to a feedback capacitor $C_{FB}$ 450. The value of input resistor $R_{VT}$ is chosen as a scaled down value of the feedback resistor, because the line driver is designed to have a gain larger than 1, thus acting as an amplifier.

The positive feedback path is shorted and coupled via adjustable or calibrated termination resistor $R_T$ 460 to a direct current voltage source $V_{CM}$, which defines the common mode voltage of the output signal $V_{OUT}$.

The IEEE standard requires a differential output amplitude of the line driver circuit between 2.2 Volts and 2.8 Volts with nominal 2.5 Volts on a cable impedance $R_{CABLE}$ 470 of 100Ω. As FIG. 4 depicts half of the circuit the value of the cable is half of the specification, i.e. 50Ω. In this embodiment the nominal supply voltage of the circuit shall be 3.3 Volts, so the DAC can easily generate a 0.5 Volt full scale output. To reach the required voltage swing the line driver must have a gain of 2.5 times. Since the line driver output gets divided over the cable impedance and the output impedance of driver circuit 400 equally, the 2.5 times gain is implemented by making $1+R_{FB}/R_{VT}=5$, which results in $R_{FB}=4\cdot R_{VT}$. The value of the input resistor is chosen to be much higher, i.e. for example 10 times higher, than the resistance of the cable in order to achieve a high input impedance of the line driver, such that the line driver has the characteristic of a high input impedance and a matching output impedance, as illustrated below. Convenient values for the resistors may be for example $R_{VT}=1k\Omega$ and $R_{FB}=4k\Omega$. $R_T$ is calculated from the output impedance equation, $$ROUT \approx RT\frac{RVI + RFB}{RVI}$$

as 50Ω/5=10Ω. If it is assumed that amplifier 430 has its negative output current scaled 10 times smaller that its positive output current, such that the value of $R_T$ scales 10 times higher to 100Ω.

The amplitude of the output signal Vout is given as $$VOUT \approx VSIG\left(1 + \frac{RFB}{RVI}\right)\frac{RCABLE}{RCABLE + RT}$$

As 3.3 Volts is a widespread supply voltage for integrated circuits circuit 400 is designed to be supplied with this voltage. Accordingly amplifiers 420, 421 are supplied with 3.3 Volts, which can drop to 3.0 Volts as mentioned above. Consequently the circuit should be able to properly operate at a voltage of 3.0 Volts. That is, the specifications relating to the amplitude of the output signal amplitude and to the output impedance of the line driver should be met also when operating the circuit with 3.0 Volts.

According to the above given equation the amplitude of the output signal $V_{OUT}$ depends on the impedance $R_{CABLE}$ of the transmission line, i.e. the cable, and the termination resistor $R_T$. As $R_T$ is produced as an on-chip resistor it may have a production spread of ±15% from its nominal value. So for achieving a tighter control over $V_{OUT}$ the termination resistor $R_T$ is made adjustable, such that it may not vary by more than 2% from its nominal value.

The calibration of termination resistor $R_T$ can be done in a number of conventional ways. For example switches can be inserted between different gaps of the resistor and the common mode voltage source $V_{CM}$, wherein the switches increase or reduce the resistivity value of $R_T$. The switches itself show very low resistance in their on state and very little signal dependency since they are coupled to a DC biased node, namely $V_{CM}$, such that the switches itself have a negligible overall impact on the circuit. The setting of these switches can be done at the time when the circuit is powered on. A separate circuit, which is not shown in the drawings, determines the setting of the switches by comparing one of a plurality of termination resistors $R_T$ included in one chip to a reference resistor. The determined setting can be for example a binary word, which can be spread on the chip to a plurality of termination resistors comprised in one chip. The determination of the settings may be performed for one termination resistor and spread over the chip to all termination resistors, because it is known from experience that all termination resistors comprised in one chip and thus originating from one wafer show very similar values. In this way, i.e. by determining the switch settings for one termination resistor and spreading these values to all termination resistors of the chip the resistivity value of each termination resistor can be adjusted to a deviation of less than 2%.

More care must be taken to maintain proper voltage conditions for the operation of amplifier 420 respectively. So in case the supply voltage drops to 3.0 Volts the swing of output signal $V_{OUT}$ still should be in the range defined by the IEEE 802.3 standard, while at the same time there should be enough voltage difference between the supply voltage of the amplifiers, which will be 3.0 Volts, and the maximum amplitude of output signal $V_{OUT}$ to enable a sufficient source drain voltage for operating an output stage transistor in amplifier 420.

As shown above in the equation $V_{OUT}$ directly depends on the amplitude of the input voltage $V_{SIG}$. Accordingly the input voltage $V_{SIG}$, which is output from DAC 120 as shown in FIG. 2, is controlled so that it also drops in case the supply voltage drops to effectuate a reduced output signal $V_{OUT}$.

For example assuming the DAC reference signal to be 50% supply-independent and 50% supply-dependent, a closed-loop line driver gain of 2.5 and normal conditions, i.e. when the supply voltage has its nominal value of 3.3 Volts, the input signal Vsig may have an amplitude of 1 Volt and the output signal $V_{OUT}$ may have an amplitude of 2.5 Volts such that there is a difference of 0.8 Volts between the output signal amplitude and the supply voltage of the amplifier 420.

In case the supply voltage increases for example to 3.6 Volts, then the input signal $V_{SIG}$ increases to an amplitude of 1.05 Volts and the output signal $V_{OUT}$ may have a value of 2.625 Volts, which is still in the specified IEEE standard limits. The difference between the supply voltage and the output signal $V_{OUT}$ is thus 0.975 Volts.

In case the supply voltage decreases to a value of 3.0 Volts, a reduced input voltage $V_{SIG}$ of 0.95 Volts is fed into circuit 400, which effectuates a drop of the amplitude of the output signal, i.e. the voltage of the 10 BT Ethernet signal, to 2.375 Volts, which is still in the allowed range. The difference between the supply and the output voltage in this case is 0.625 Volts.

Conventional differential amplifiers in many embodiments comprise two transistors in their output stage, which are coupled with their source—drain path between the supply and the output voltage. For enabling a proper operation of these transistors the source—drain voltage of these transistors must be large enough, i.e. at least 0.2 Volts for each transistor. As these voltages add for the two exemplary transistors in the output stage of the exemplary differential amplifier, there should be at least a voltage of 0.4 Volts between the supply and the maximum output voltage of the differential amplifier.

As shown above this minimum voltage between supply and maximum output voltage of a conventional differential amplifier is exceeded in each of the operating conditions, i.e. in particular the supply voltage drops from 3.3 Volts to 3.0 Volts. Accordingly circuit 400 allows the proper operation of the comprised differential amplifiers while preserving operating conditions for the transistors making the output stage.

In this way FIG. 4 discloses a circuit of an active output impedance line driver comprising a differential amplifier, the negative input terminal coupled via an input resistor to an input terminal, the positive output terminal providing an output signal, and wherein at least a feedback resistor forms a negative feedback path, and wherein the positive feedback path is shorted and coupled by an adjustable termination resistor to the residual in- and output terminal of the line driver and a common mode voltage source.

Figure 5:
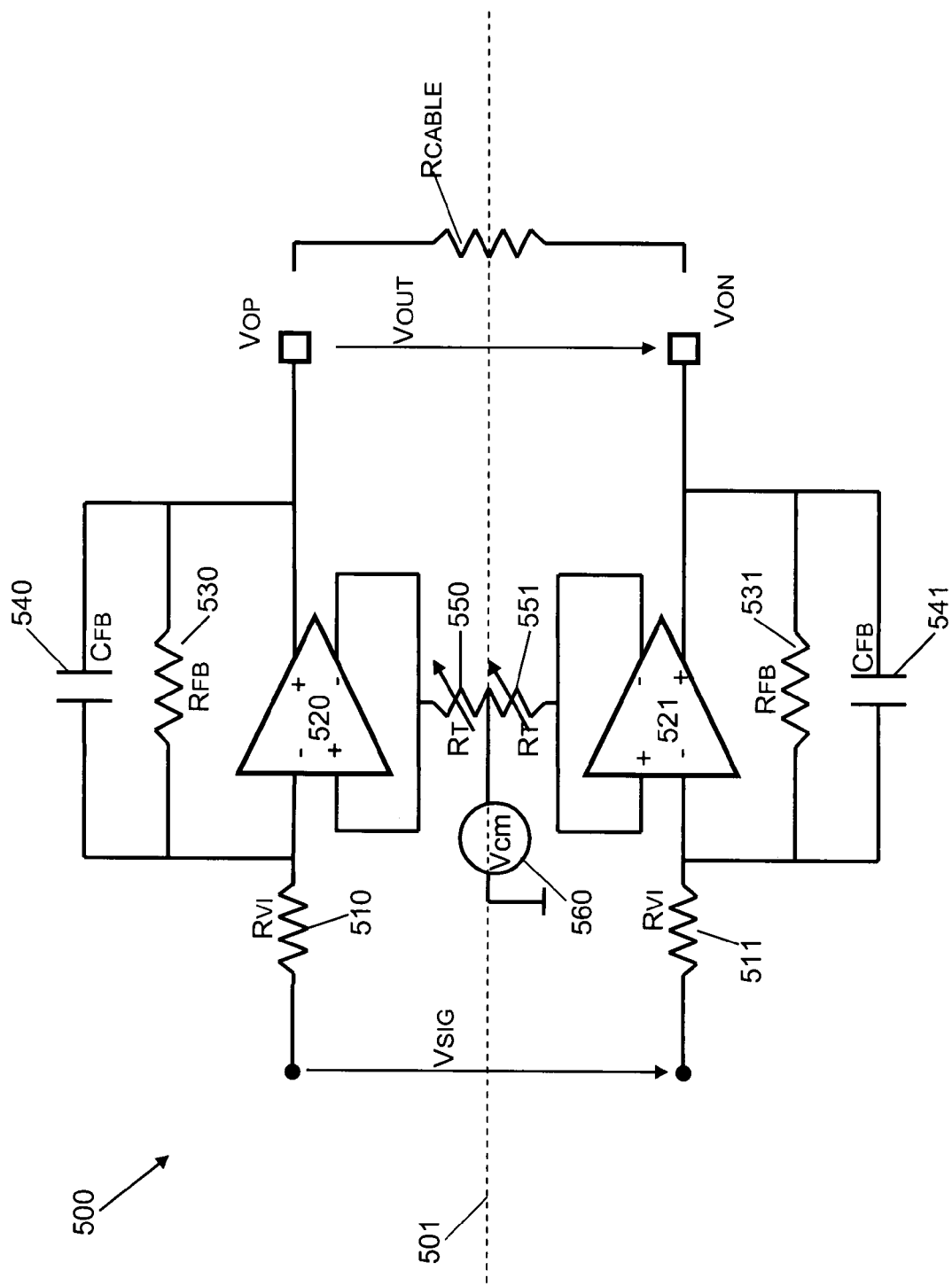
FIG. 5 depicts a circuit of a 10 BT active output impedance line driver comprising two identical, mirrored circuit portions

FIG. 5 depicts a circuit 500 of an exemplary implementation of an active output impedance line driver, wherein the circuit comprises two circuit portions of identical topology, such that the drawing shows one circuit portion above and the other circuit portion below mirror line 501. As the input signal $V_{SIG}$ and also the output signal $V_{OUT}$ are differential signals one circuit portion processes the positive and one signal portion processes the negative signal portion of the output signal $V_{OUT}$, such that for example the positive output signal portion of $V_{OUT}$ is output at pad $V_{OP}$ and the negative output signal portion is output at pad $V_{ON}$.

In the following description of FIG. 5 even reference numerals refer to the circuit portion processing above mirror line 501 whereas uneven reference numbers denote elements below the mirror line.

The topology of each circuit portion is similar to the circuit as depicted in FIG. 4. Accordingly each circuit portion comprises an input resistor $R_{VI}$ 510, 511 coupled to the input signal $V_{SIG}$ and to the negative input terminal of a differential amplifier 520, 521. Amplifiers 520, 521 comprise in their respective negative feedback loops a feedback resistor $R_{FB}$ 530, 531 parallel to a feedback capacitor $C_{FB}$ 540, 541. The positive output terminals of amplifiers 520, 521 each form an output terminal of the driver, so that the output signal is provided between the positive output terminals of the differential amplifiers 520 and 521. The positive feedback paths of each amplifier is shorted to the negative input and coupled via an adjustable termination resistor $R_T$ 550 and 551 to a direct current common mode voltage source $V_{CM}$ 560.

As described above the calibration of termination resistors $R_T$ can be done in a number of conventional ways, in which the value of each resistor is adjusted by providing an electrical signal to these, such that the resistors can be adjusted when the circuit or the integrated circuit comprising the line driver is powered up.

Example values for the passive elements in the circuit can be chosen as in FIG. 4 and the resulting output impedance of this pseudo-differential circuit is twice the output impedance of the single ended circuit as depicted in FIG. 4.

Figure 6:
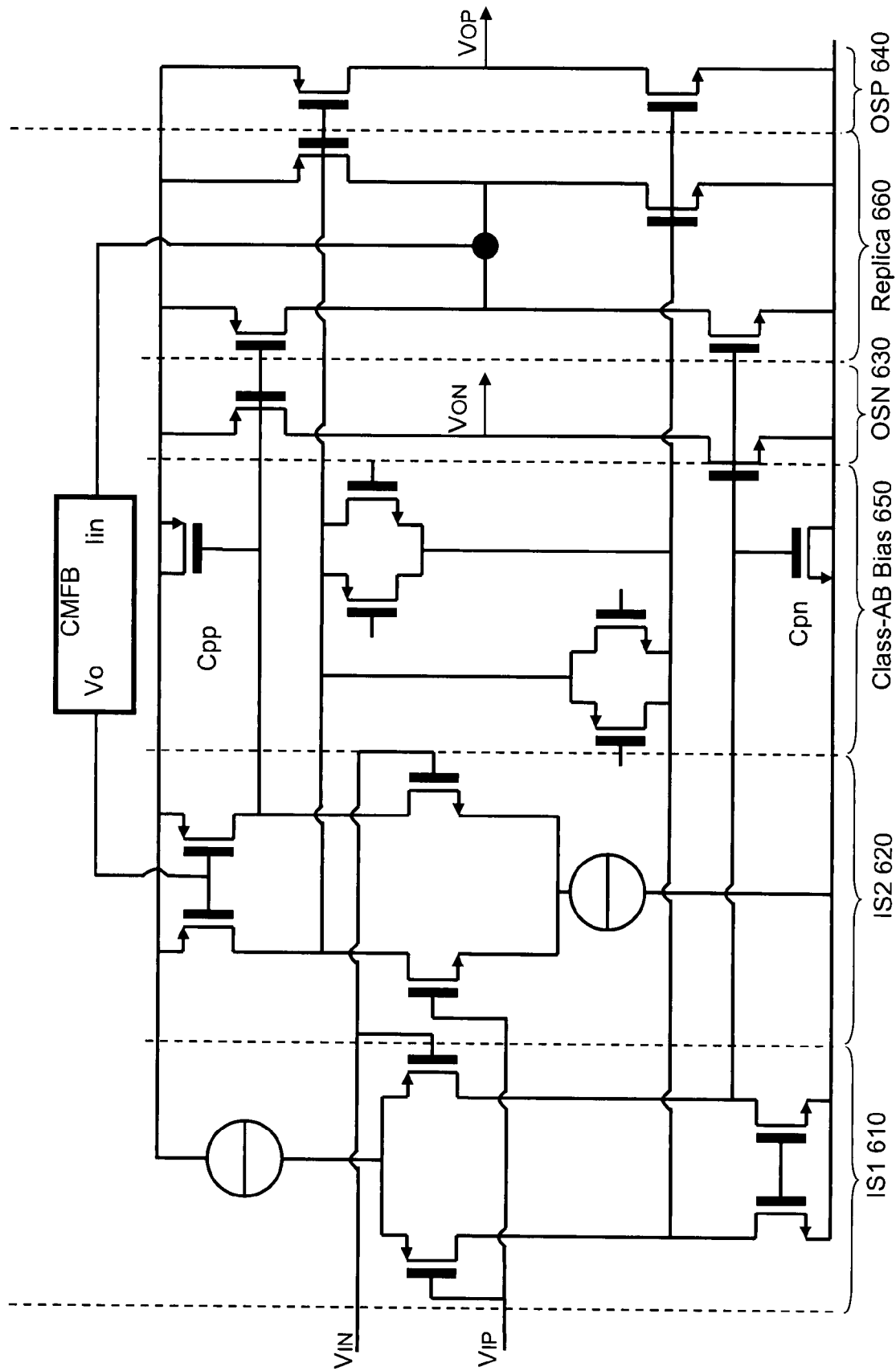
FIG. 6 depicts an embodiment of a differential amplifier

FIG. 6 depicts an exemplifying embodiment of a differential amplifier 600, which can be amplifier 430 of FIG. 4. The negative and positive input terminals of the amplifier 600 are labeled $V_{IN}$ and $V_{IP}$ and the negative and positive output terminals are labeled $V_{ON}$ and $V_{OP}$ respectively.

Amplifier 600 comprises a first input stage IS1 610 and a second input stage IS2 620, which are directly coupled to a first and a second output stage OSN and OSP 630, 640 and to the dual class-AB biasing mesh 650. A common mode loop uses four replica transistors 660 to get the sum of all currents in the two output stages, which drives a current-input, voltage-output common-mode feedback loop (CMFB) generating a biasing voltage for one of the input stages. This makes the sum of biasing currents in the PMOS side of the two output stages equal the sum of the biasing currents in the NMOS side, so that no offset current is drawn from the load.

The topology of the differential amplifier is thus designed for power efficiency since no intermediate stages between the input and output stages are used. Also the output stages, which draw a large current at 2.5 Volts peak output on 100Ω loads, are biased in class-AB so that the power consumption is reduced when the output voltage is near a zero-crossing. Furthermore the negative output stage OSN can be designed as a scaled version of the positive output stage OSP to reduce power consumption, which effectuates the design of the termination resistor $R_T$.

What is claimed is:

1. An integrated circuit including an active output impedance line driver circuit comprising a differential amplifier, the negative input terminal coupled via an input resistor to an input terminal, the positive output terminal providing an output signal, wherein at least a feedback resistor forms a negative feedback path, and wherein the positive feedback path is shorted and coupled by an adjustable termination resistor to the residual in- and output terminal of the line driver and a common mode voltage source.

2. The integrated circuit of claim 1, wherein a feedback capacitor is arranged in parallel to the feedback resistor in the negative feedback path.

3. The integrated circuit of claim 1, wherein the adjustable termination resistor is adapted to be adjusted by an electrical signal.

4. The integrated circuit of claim 1, wherein the electrical signal is comprised of bits.

5. The integrated circuit of claim 1, further comprising a reference resistor and means for determining an electrical signal to control the adjustable termination resistor.

6. The integrated circuit of claim 1, wherein the input resistor is much bigger than the cable resistance.

7. The integrated circuit of claim 1, wherein the value of the input resistor is a scaled down value of the feedback resistor, such that the line driver has a gain larger than 1.

8. The integrated circuit of claim 1, wherein the value of the input resistor is 4 times smaller the value of the feedback resistor.

9. The integrated circuit of claim 8, wherein the value of the input resistor is 1 kQΩ and the value of the feedback resistor is 4 kΩ.

10. The integrated circuit of claim 1, wherein the negative output current of the amplifier is a scaled down value of the positive output current, thus power consumption is minimized.

11. The integrated circuit of claim 1, wherein the negative output current of the amplifier is 10 times smaller than the positive output current and the value of the termination resistor is scaled to 100 Ω.

12. The integrated circuit of claim 1, wherein the circuit is adapted to be operated at a supply voltage of nominal 3.3 Volts.

13. The integrated circuit of claim 1, wherein the circuit is fabricated in CMOS technology.

14. A method for operating an integrated circuit comprising an active output impedance line driver according to claim 1 for producing an output signal from an input signal, wherein the amplitude of the input signal is decreased in case the supply voltage of the active output impedance line driver drops.

15. The method of claim 14, wherein the input signal is decreased proportionally to the decrease of the supply voltage.

16. The method of claim 14, wherein the input signal is decreased by 50% of the decrease of the supply voltage decrease.

17. The method of claim 14, wherein the adjustable termination resistor is calibrated when the circuit is powered up.

18. An integrated circuit including a system for producing a 10 BT Ethernet signal from digital symbols to be transmitted comprising:
   digital-to-analog converter (DAC) for converting the digital symbols to a corresponding analog voltage signal and
   an active output impedance line driver receiving the analog voltage signal as input and producing the corresponding 10 BT Ethernet signal and
   a calibration circuit for producing a digital word used to calibrate a termination resistor and
   a reference circuit producing a voltage reflecting an amplitude of the supply voltage of the active output impedance line driver, and
   wherein the DAC is coupled to the reference circuit and the reference signal controls the amplitude of the analog signal to follow variations of the supply voltage proportionally.

19. The integrated circuit of claim 18, wherein the reference circuit comprises a first voltage-to-current converter receiving a bandgap voltage as input signal and a second voltage-to-current converter receiving the supply voltage of the 10 BT line driver as input signal, and wherein the output currents of the converters are fed into one resistor to produce the reference voltage.

20. The integrated circuit of claim 19, wherein the DAC, the active output impedance line driver and the calibration circuit are coupled to the same supply voltage.

21. The integrated circuit of claim 18, wherein the nominal supply voltage is 3.3 Volts.

22. The circuit of claim 15, wherein the circuit is fabricated in CMOS technology.

* * * * *